US007777487B2

(12) United States Patent
Ying et al.

(10) Patent No.: US 7,777,487 B2
(45) Date of Patent: Aug. 17, 2010

(54) METHODS AND APPARATUS FOR JOINT IMAGE RECONSTRUCTION AND COIL SENSITIVITY ESTIMATION IN PARALLEL MRI

(75) Inventors: Lei Ying, Kenosha, WI (US); Jinhua Sheng, Chicago, IL (US)

(73) Assignee: UWM Research Foundation, Inc., Milwaukee, WI (US)

( * ) Notice: Subject to any disclaimer, the term of this patent is extended or adjusted under 35 U.S.C. 154(b) by 37 days.

(21) Appl. No.: 12/032,155

(22) Filed: Feb. 15, 2008

(65) Prior Publication Data

US 2008/0197844 A1 Aug. 21, 2008

Related U.S. Application Data

(60) Provisional application No. 60/890,132, filed on Feb. 15, 2007, provisional application No. 60/987,646, filed on Nov. 13, 2007.

(51) Int. Cl.
*G01V 3/00* (2006.01)

(52) U.S. Cl. .................................... 324/309

(58) Field of Classification Search ......... 324/300–322; 600/410–435
See application file for complete search history.

(56) References Cited

U.S. PATENT DOCUMENTS

| | | | | | |
|---|---|---|---|---|---|
| 5,808,467 | A | * | 9/1998 | Ochi et al. | 324/309 |
| 5,910,728 | A | * | 6/1999 | Sodickson | 324/309 |
| 6,734,673 | B2 | * | 5/2004 | Agrikola | 324/318 |
| 6,965,232 | B2 | * | 11/2005 | Sodickson | 324/307 |
| 7,042,217 | B2 | * | 5/2006 | Zwanenburg et al. | 324/309 |
| 7,423,430 | B1 | * | 9/2008 | Sharif et al. | 324/309 |

OTHER PUBLICATIONS

Griswold, M.A. et al., "Generalized autocalibrating partially parallel acquisitions (GRAPPA)," Magn. Reson. Med. (2002) 47:1202-1210.
Griswold, M.A. et al., "Partially parallel imaging with localized sensitivities (PILS)," Magn. Reson. Med. (2000) 44:602-609.
Heidemann, R.M. et al., "VD-AUTO-SMASH imaging," Magn. Reson. Med. (2001) 45:1066-1074.
Jakob, P.M. et al., "AUTO-SMASH: a self-calibrating technique for SMASH imaging," MAGMA (1998) 7:42-54.
Kellman, P. et al., "Adaptive sensitivity encoding incorporating temporal filtering (TSENSE)," Magn. Reson. Med. (2001) 45:846-852.
King, K.F., "Efficient variable density SENSE reconstruction," in Proceedings of the 13th Annual Meeting of ISMRM, Miami, FL (2005) 2418.

(Continued)

Primary Examiner—Brij B Shrivastav
Assistant Examiner—Dixomara Vargas
(74) Attorney, Agent, or Firm—Michael Best & Friedrich LLP

(57) ABSTRACT

A method of parallel magnetic resonance imaging (pMRI) comprising acquiring pMRI signals simultaneously through a plurality of receiving coils, wherein each coil has a localized sensitivity with respect to an imaged volume; jointly estimating values for the imaged volume and for a sensitivity function for at least one of the plurality of receiving coils; and transmitting the reconstructed image to a device.

19 Claims, 13 Drawing Sheets

OTHER PUBLICATIONS

Kyriakos, W.E. et al., "Sensitivity profiles from an array of coils for encoding and reconstruction in parallel (SPACE RIP)," Magn. Reson. Med. (2000) 44:301-308.

Lin, F-H. et al., "A wavelet-based approximation of surface coil sensitivity profiles for correction of image intensity inhomogeneity and parallel imaging reconstruction," Human Brain Mapping (2003) 19:96-111.

Lin, F-H. et al., "Parallel imaging reconstruction using automatic regularization," Magn. Reson. Med. (2004) 51:559-567.

Madore, B. et al., "Unaliasing by Fourier-encoding the overlaps using the temporal dimension (UNFOLD) applied to cardiac imaging and fMRI," Magn. Reson. Med. (1999) 42:813-828.

Madore, B., "UNFOLD-SENSE: a parallel MRI method with self-calibration and artifact suppression," Magn. Reson. Med. (2004) 52:310-320.

McKenzie, C.A. et al., "Self-calibrating parallel imaging with automatic coil sensitivity extraction," Magn. Reson. Med. (2002) 47:529-538.

Pruessmann, K.P. et al., "Advances in sensitivity encoding with arbitrary k-space trajectories," Magn. Reson. Med. (2001) 46:638-651.

Pruessmann, K.P. et al., "SENSE: Sensitivity encoding for fast MRI," Magn. Reson. Med. (1999) 42:952-962.

Samsonov, A.A. et al., "POCSENSE: POCS-based reconstruction method for sensitivity encoding magnetic resonance imaging," Magn. Reson. Med. (2004) 52:1397-1406.

Sodickson, D.K. et al., "A generalized approach to parallel magnetic resonance imaging," Med. Phys. (2001) 28:1629-1643.

Sodickson, D.K. et al., "Simultaneous acquisition of spatial harmonics (SMASH): fast imaging with radiofrequency coil arrays," Magn. Reson. Med. (1997) 38:591-603.

Xu, D. et al., "Optimizing SENSE for dynamic imaging," in Proceedings of the 13th Annual Meeting of ISMRM, Miami, FL (2005) 2419.

Ying, L. et al., "On Tikhonov regularization for image reconstruction in parallel MRI," in Proceedings of 26th Annual International Conference of the IEEE EMBS, San Francisco, CA (2004) 1056-1059.

Yuan, L. et al., "Truncation effects in SENSE reconstruction," in Proceedings of 26th International Conference of IEEE EMBS, San Francisco, CA (2004) 1136-1139.

* cited by examiner

METHODS AND APPARATUS FOR JOINT IMAGE RECONSTRUCTION AND COIL SENSITIVITY ESTIMATION IN PARALLEL MRI

CROSS-REFERENCE TO RELATED APPLICATIONS

This application claims priority to U.S. Provisional Applications No. 60/890,132, filed Feb. 15, 2007, and 60/987,646, filed Nov. 13, 2007, each of which is incorporated herein by reference in its entirety.

STATEMENT REGARDING FEDERALLY SPONSORED RESEARCH OR DEVELOPMENT

This invention was made with government support under 5R01CA098717-04 awarded by the National Institutes of Health and CBET-0731226 awarded by the National Science Foundation. The government has certain rights in the invention.

BACKGROUND

1. Field of Invention

The present invention relates to parallel magnetic resonance imaging (pMRI) and in particular to methods of reconstructing pMRI images.

2. Related Art

Parallel magnetic resonance imaging (pMRI), as a fast imaging method, uses an array of radio frequency (RF) receiver surface coils to acquire multiple sets of under-sampled k-space data simultaneously. A number of techniques, operating in either k-space or the image domain, have been proposed for reconstructing a complete MR image from these under-sampled data.

SUMMARY OF THE INVENTION

In one embodiment, the invention is a method of parallel magnetic resonance imaging (PMRI) comprising acquiring pMRI signals simultaneously through a plurality of receiving coils, wherein each coil has a localized sensitivity with respect to an imaged volume; jointly estimating values for the imaged volume and for a sensitivity function for at least one of the plurality of receiving coils; and transmitting the reconstructed image to a device.

In another embodiment the invention is a method of parallel magnetic resonance imaging (PMRI) comprising (a) acquiring pMRI signals simultaneously through a plurality of receiving coils, wherein each coil has a localized sensitivity with respect to an imaged volume; (b) using at least some of the acquired pMRI signals to estimate a sensitivity function for at least one of the plurality of receiving coils; (c) reconstructing an image of a sample from the pMRI signals from the plurality of receiving coils using the estimated sensitivity function; (d) using the reconstructed image to provide new estimates of the sensitivity function for at least one of the plurality of receiving coils; (e) iteratively repeating steps (c)-(d) at least once; and (f) transmitting the reconstructed image to a device, wherein transmitting the reconstructed image to a device comprises at least one of: saving the reconstructed image to storage media, printing the reconstructed image on a printing device, and displaying the reconstructed image on a display device.

In still another embodiment, the invention is a method of parallel magnetic resonance imaging (pMRI) comprising (a) acquiring pMRI signals simultaneously through a plurality of receiving coils each having a localized sensitivity with respect to an imaged volume; (b) using at least some of the acquired pMRI signals to estimate a sensitivity function for at least one of the plurality of receiving coils; (c) reconstructing an image of a sample from the pMRI signals from the plurality of receiving coils using the estimated sensitivity functions; (d) using the reconstructed image to provide new estimates of the sensitivity functions for at least one of the plurality of receiving coils; (e) minimizing a cost function comprising the image and the sensitivity functions for at least one of the plurality of receiving coils; (f) iteratively repeating steps (c)-(e) at least once; and (g) transmitting the reconstructed image to a device, wherein the device comprises at least one of a storage device, a printing device, and a display device.

In yet another embodiment, the invention is a computer application stored on a computer-readable medium for reconstructing images from a parallel magnetic resonance imaging (PMRI) system, the computer application comprising executable instructions to (a) acquire pMRI signals simultaneously through a plurality of receiving coils, wherein each coil has a localized sensitivity with respect to an imaged volume; (b) estimate a sensitivity function for at least one of the plurality of receiving coils using at least some of the acquired pMRI signals; (c) reconstruct an image of a sample from the MRI signals from the multiple receiving coils using the estimated sensitivity function; (d) use the reconstructed image to provide new estimates of the sensitivity function for at least one of the plurality of receiving coils; (e) iteratively repeat steps (c)-(d) at least once; and (f) transmit the reconstructed image to a device.

In still another embodiment, the invention is a parallel magnetic resonance imaging (PMRI) system, comprising a magnetic energy source adjacent to a sample chamber; a plurality of receiver coils adjacent to the sample chamber; a data collection system configured to acquire signals from the plurality of receiver coils; an image reconstruction software system; and an image display device; wherein the image reconstruction software system is configured to (a) estimate a sensitivity function for at least one of the plurality of receiver coils using at least some of the acquired pMRI signals; (b) reconstruct an image of the sample from the pMRI signals from the plurality of receiver coils using the estimated sensitivity function; (c) use the reconstructed image to provide new estimates of the sensitivity functions for at least one of the plurality of receiving coils; (d) iteratively repeat steps (b)-(c) at least once; and (e) transmit the reconstructed image to a device.

BRIEF DESCRIPTIONS OF THE DRAWINGS

Other objects and advantages of the invention will become apparent upon reading the following detailed description and upon reference to the accompanying drawings in which.

Figure 5:
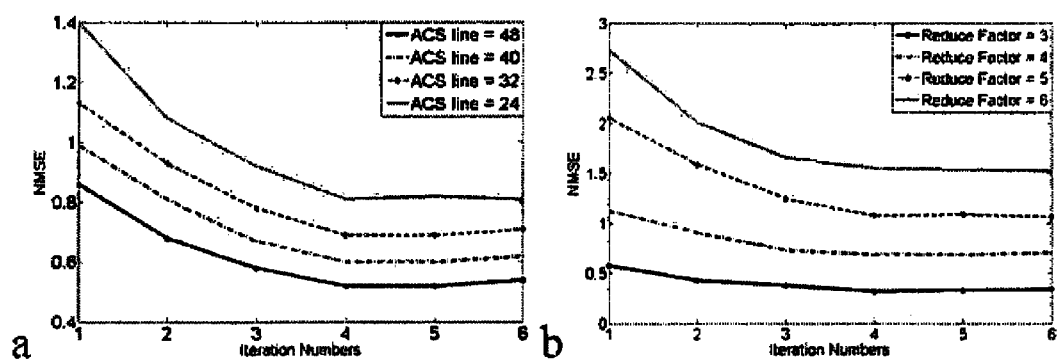
Figures 6A, 6B, 6C:
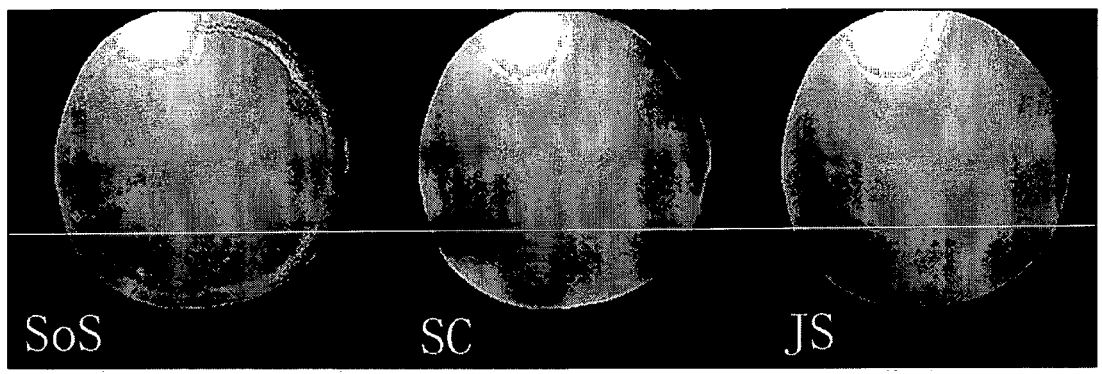
Figures 7A, 7B, 7C:
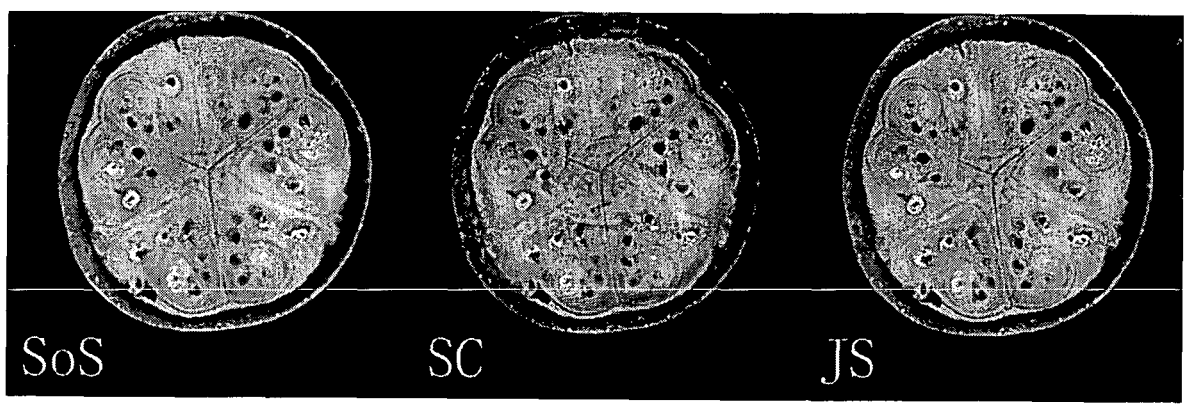
Figure 8:
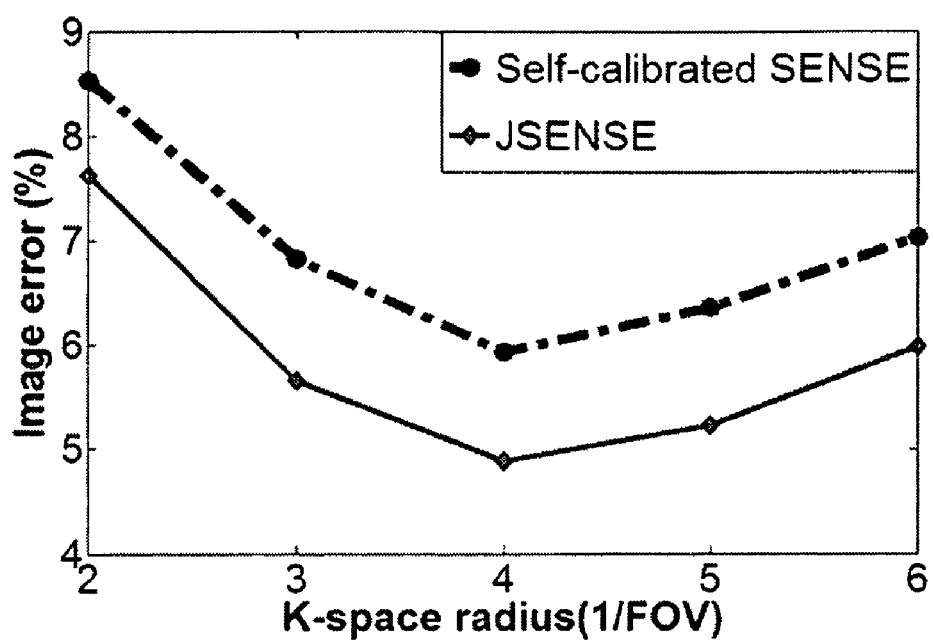
Figures 9A, 9B, 9C:
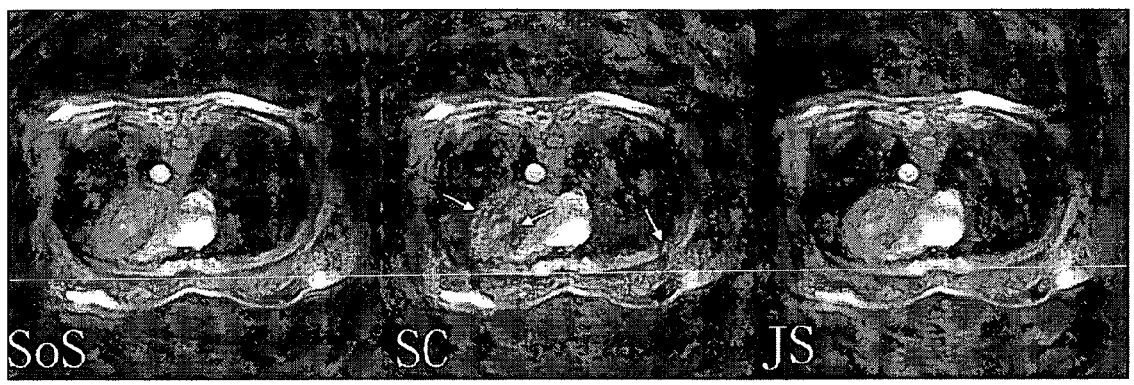
Figure 10:
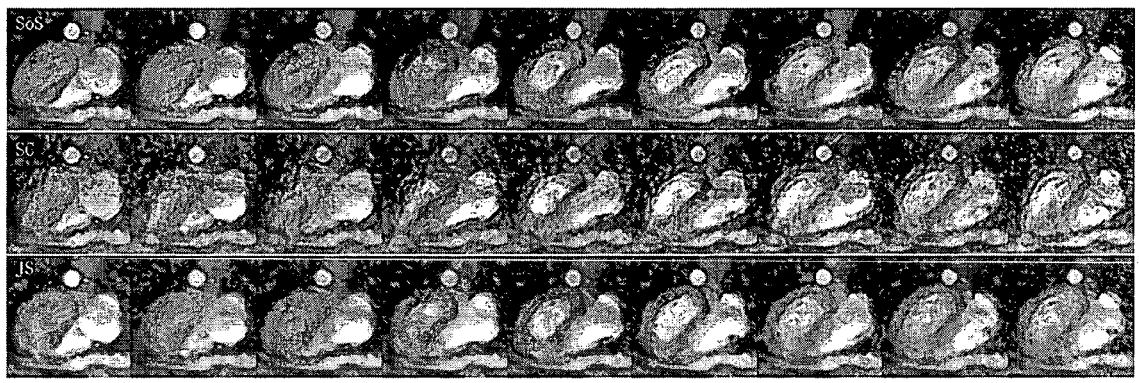

FIGS. 3a-3h show brain images with a nominal reduction factor of 3 reconstructed using SoS (FIG. 3a), GSENSE (FIG. 3b), and the methods of the present invention (JSENSE) (FIG. 3c); the g-maps are shown on the second row corresponding to the sensitivities from full-scan data (FIG. 3d), self-calibration (FIG. 3e), and JSENSE (FIG. 3f); the difference maps between GSENSE and SoS reconstructions (FIG. 3g), and JSENSE and SoS reconstructions (FIG. 3h) are shown on the third row;

FIGS. 4a-4h show brain images with a nominal reduction factor of 5 reconstructed using SoS (FIG. 4a), GSENSE (FIG. 4b), and the methods of the present invention (JSENSE) (FIG. 4c); the g-maps are shown on the second row corresponding to the sensitivities from full-scan data (FIG. 4d), self-calibration (FIG. 4e), and JSENSE (FIG. 4f); the difference maps between GSENSE and SoS reconstructions (FIG. 4g), and JSENSE and SoS reconstructions (FIG. 4h) are shown on the third row;

FIGS. 5a-5b show graphs of normalized mean-squared-error (NMSE) vs. number of iterations in JSENSE for different ACS lines when $R_{nom}$=4 (FIG. 5a), and for different $R_{nom}$ with 32 ACS lines (FIG. 5b);

FIGS. 6a-6c show estimated sensitivity maps of the first channel of a watermelon phantom comparing reconstructions based on full data (FIG. 6a, "SoS"); self-calibration (FIG. 6b, "SC"); and JSENSE with self-calibration as the initial estimate (FIG. 6c, "JS");

FIGS. 7a-7c show estimated sensitivity maps of the first channel of a watermelon phantom comparing reconstructions based on SoS from full data (FIG. 7a, "SoS"); self-calibrated spiral SENSE (FIG. 7b, "SC"); and JSENSE from 8-channel reduced data by a factor of 2 (FIG. 7c, "JS");

FIG. 8 shows a graph comparing the normalized mean-squared-errors (NMSEs) of JSENSE and self-calibrated SENSE using self-calibration data within different k-space radii for the watermelon phantom data;

FIGS. 9a-9c show reconstructed cardiac images using SoS from full data (FIG. 9a, "SoS"); self-calibrated spiral SENSE (FIG. 9b, "SC"); and JSENSE from 4-channel reduced data by a factor of 2 (FIG. 9c, "JS"); and FIG. 10 shows zoomed images for the cardiac reconstructions of FIG. 9 at several different cardiac phases.

DETAILED DESCRIPTION

Before any embodiments of the invention are explained in detail, it is to be understood that the invention is not limited in its application to the details of construction and the arrangement of components set forth in the following description or illustrated in the following drawings. The invention is capable of other embodiments and of being practiced or of being carried out in various ways. Also, it is to be understood that the phraseology and terminology used herein are for the purpose of description and should not be regarded as limiting. The use of "including," "comprising," or "having" and variations thereof herein is meant to encompass the items listed thereafter and equivalents thereof as well as additional items.

In magnetic resonance imaging (MRI), a sample (e.g. a human subject) is placed in a powerful magnetic field where the hydrogen protons in the sample will align with the magnetic field in one direction or the other. The MRI machine applies a radio pulse that is specific only to hydrogen. The pulse causes the protons in the region of interest to absorb energy and spin in a different direction at a particular frequency. At approximately the same time, the gradient fields are turned on and off very rapidly in a specific manner, which alter the main magnetic field on a local level. When the radio pulse is turned off, the hydrogen protons begin to return to their natural alignment within the magnetic field and release their excess stored energy in form of radio waves. The radio waves are then detected by one or more receiver coils. The data that is collected by the receiver coils is in the form of spatial frequencies, in what is called k-space of the image. Frequency data in k-space can be mathematically converted to a recognizable image in the so-called image domain using a number of procedures, including for example a Fourier transform. Reconstructions of images of the sample (e.g. a person's brain or heart) take into account information about the orientations of applied magnetic fields and the orientations of the receiver coils.

Despite numerous advances in the field, one drawback of MRI has been the relatively slow rate at which data is collected, such that long scanning times may be required. Patients may be unable to remain sufficiently still for the amount of time required to obtain an image, so that motion blurring artifacts can arise which degrade the quality of the MR images. Parallel MRI (pMRI) is a method that has been developed to address this problem by using multiple detector coils and having each coil collect less data, thus allowing faster scanning times. Parallel MRI uses an array of RF receiver surface coils to simultaneously acquire multiple sets of under-sampled k-space data. While this technique allows faster scanning of the sample, the under-sampled data that is collected has a reduced signal-to-noise ratio (SNR). The k-space data collected using pMRI is a complex combination of the actual sample data modified by the relative sensitivities of each receiver coil. Reconstructing an image of a sample acquired using pMRI requires accounting for the relative sensitivities of the coils in order to obtain the actual image data. However, the sensitivities are different for each coil and can change during data collection, making reconstruction of pMRI images challenging.

Accordingly, a number of techniques have been proposed for reconstructing a complete MR image from these under-sampled pMRI data from the array of coils, the reconstructions occurring in either k-space or the image domain. However, the k-space data collected from each coil is a function of the sensitivities of the coils, which are unknown. Some reconstruction methods, such as PILS, AUTO-SMASH, VD-AUTO-SMASH, and GRAPPA, do not require the explicit functions of coil sensitivity, while others, such as SMASH, SENSE, and SPACE-RIP, require the functions to be given exactly. For the methods in latter category, the coil sensitivities must be estimated prior to reconstructing the MR image. Consequently, the sensitivity estimation method is as important as the reconstruction algorithm.

The existing techniques for determination of sensitivity functions are not satisfactory. The most common technique has been to derive sensitivities directly from a set of reference images obtained in a separate calibration scan before or after the accelerated scans. This calibration scan can prolong total imaging time, partially counteracting the benefits of reduced acquisition time associated with pMRI. Another practical problem with this technique is that misregistrations or inconsistencies between the calibration scan and the accelerated scan result in artifacts in the reconstructed images, which is a major concern in dynamic imaging applications. Adaptive sensitivity estimation has been proposed for these applications. Based solely on the data from accelerated scans, previous methods have used the UNFOLD algorithm to generate low-temporal-resolution, aliasing-free reference images for sensitivity estimation. However, UNFOLD is limited to dynamic applications where at least half of the field-of-view remains static over time.

A more general method is the self-calibrating technique, which also eliminates a separate calibration scan but acquires variable density (VD) k-space data during the accelerated scan. The VD acquisition includes a small number of fully-sampled lines at the center of k-space, known as auto-calibration signal (ACS) lines, in addition to the down-sampled lines at outer k-space. After Fourier transformation, these central k-space lines produce low-resolution in vivo reference images $[\rho(\vec{r})s_l(\vec{r})]*h(\vec{r})$, where the product of the coil sensitivity $s_l(\vec{r})$ of the lth channel and the image of transverse magnetization $\rho(\vec{r})$ is convolved (indicated by the "*" operator) with $h(\vec{r})$, the Fourier transform of the truncation window that truncates the central k-space. The convolution is due to the use of only the central k-space data, which results in a low-resolution measurement. To derive the sensitivities, these low-resolution reference images are divided by their sum-of-squares combination:

$$\hat{s}_l(\vec{r}) \approx \frac{[\rho(\vec{r})s_l(\vec{r})]*h(\vec{r})}{\sqrt{\sum_l |[\rho(\vec{r})s_l(\vec{r})]*h(\vec{r})|^2}}. \quad [1]$$

In addition to the assumption of spatially uniform $\sqrt{\Sigma_l |[s_l(\vec{r})|^2}$, which is in common with the calibrating technique with a separate scan, Eq. [1] also assumes that the multiplication with $s_l(\vec{r})$ and the convolution with $h(\vec{r})$ are commutative, i.e., $$[\rho(\vec{r})s_l(\vec{r})]*h(\vec{r}) \approx [\rho(\vec{r})*h(\vec{r})]s_l(\vec{r}), \quad [2]$$

where equality holds only if $h(\vec{r})$ is a dirac delta function, i.e., when there is no data truncation, or $s_l(\vec{r})$ is spatially a constant. In general, the approximation in Eq. [2] requires $s_l(\vec{r})$ to be much smoother than $h(\vec{r})$, i.e., the range of spatial frequencies covered in the ACS lines is much broader than the spatial frequency band of the coil sensitivity functions, which, however, contradicts the goal of pMRI of reducing the scanning time.

Apodization (i.e. mathematically smoothing the outer edges) of the central k-space data can also be used to shape $h(\vec{r})$ for a better approximation in Eq. [2]. If a small number of ACS lines are used, suggesting large data truncation, the approximation in Eq. [2] fails such that the Gibbs ringing artifacts due to truncation in the reference images cannot be cancelled by the division of their sum-of-square combination described in Eq. [1]. This leads to truncation errors in all sensitivity functions, which become particularly serious at locations where the object transverse magnetization has high spatial frequency components. These ringing errors are only minimally reduced by the commonly-used polynomial-fitting or wavelet-denoising techniques for sensitivities. Consequently, the pMRI reconstruction suffers from aliasing artifacts. Therefore, improving the sensitivity accuracy using only a small amount of high-resolution ACS data is crucial for pMRI techniques, in order to achieve a high acceleration.

To address one or more of the above-discussed problems, embodiments of the invention include a method of reconstructing pMRI data which jointly estimates the coil sensitivities and reconstructs the desired image, as opposed to the sequential estimation of coil sensitivities followed by image reconstruction in conventional techniques. In particular, embodiments herein address the issue of sensitivity errors by iteratively correcting the sensitivity functions using all or substantially all of the acquired VD k-space data, not just the ACS lines.

Figure 1A:
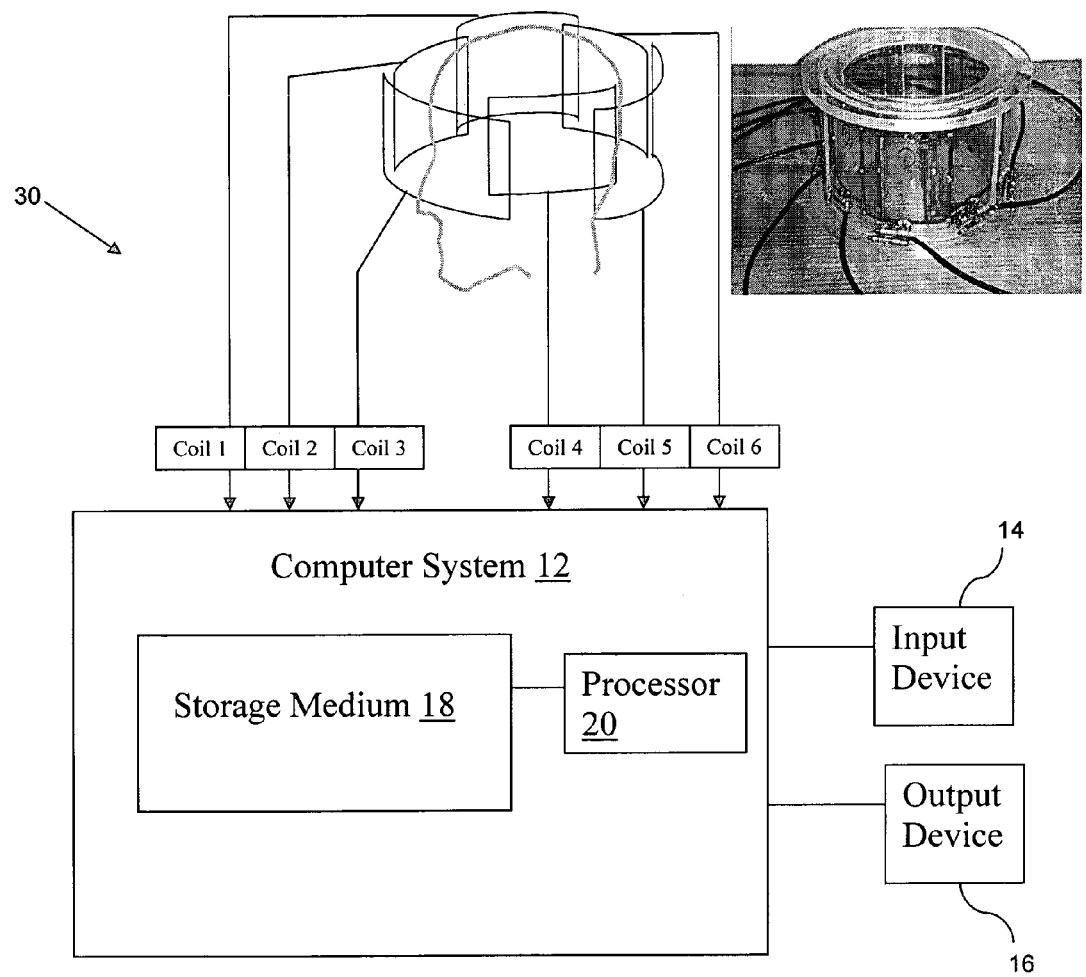
FIG. 1a shows a diagram of a parallel magnetic resonance imaging device and associated computer acquisition and processing system.
Figure 1B:
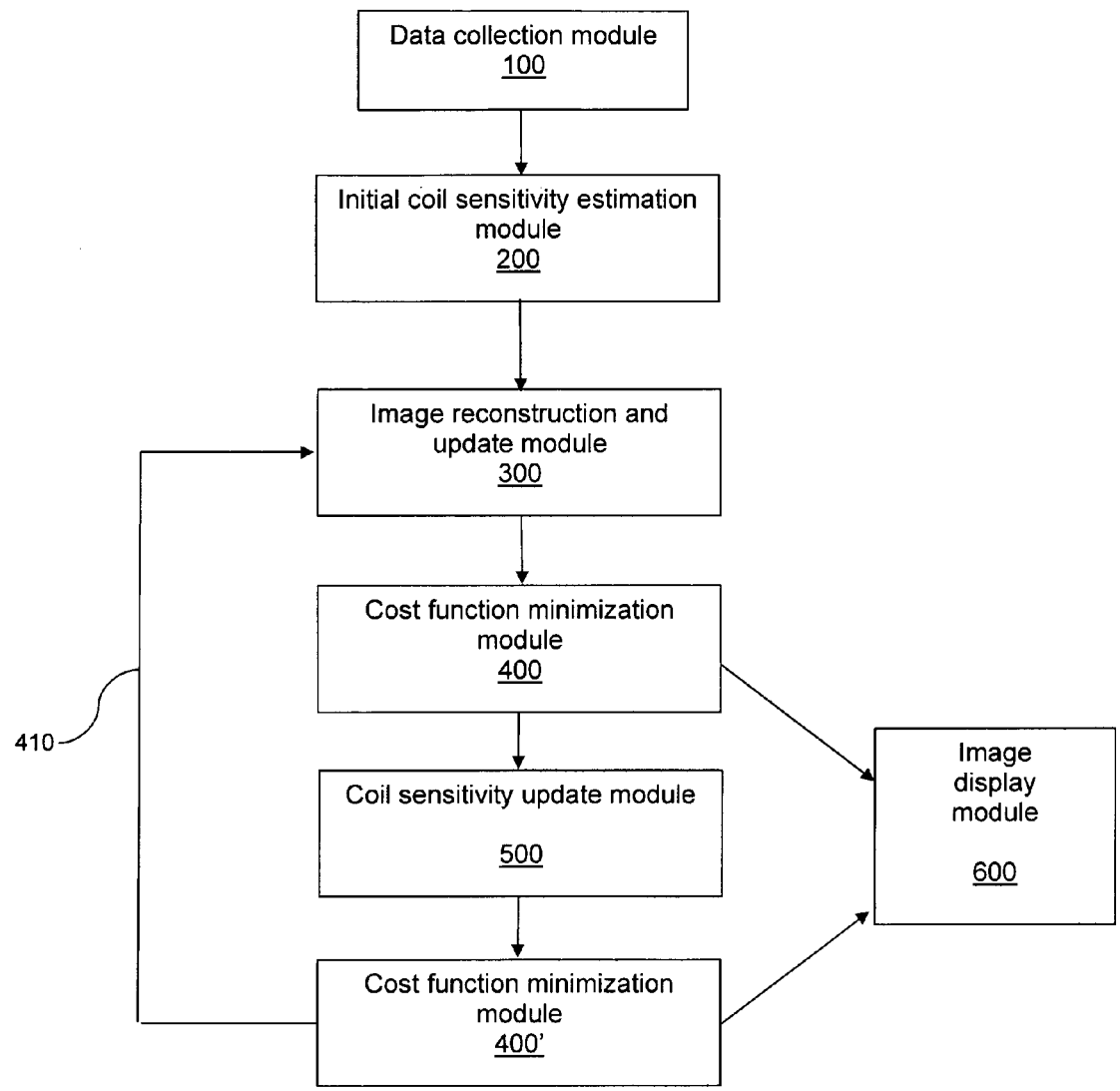
FIG. 1b shows a block diagram of one embodiment of the inventive apparatus.

A block diagram of an apparatus according to an embodiment of the invention is shown in FIG. 1b. A data collection module 100, such as a parallel MRI system, collects k-space data. Next, an initial coil sensitivity estimation module 200 generates an initial estimate of the coil sensitivities. Subsequently, an image reconstruction and update module 300 generates an image of the sample, based on the estimated coil sensitivities. Then a cost function minimization module 400 determines if a cost function has stopped decreasing. If the cost function has stopped decreasing, then the reconstructed image is displayed by the image display module 600. If the cost function has not stopped decreasing, then the coil sensitivities are updated by a coil sensitivity update module 500. Again, a cost function minimization module 400' determines if a cost function has stopped decreasing. If the cost function has stopped decreasing, then the most recent reconstructed image is displayed by the image display module 600. If the cost function has not stopped decreasing, then the apparatus iterates 410 back to the image update and reconstruction module 300.

Figure 1C:
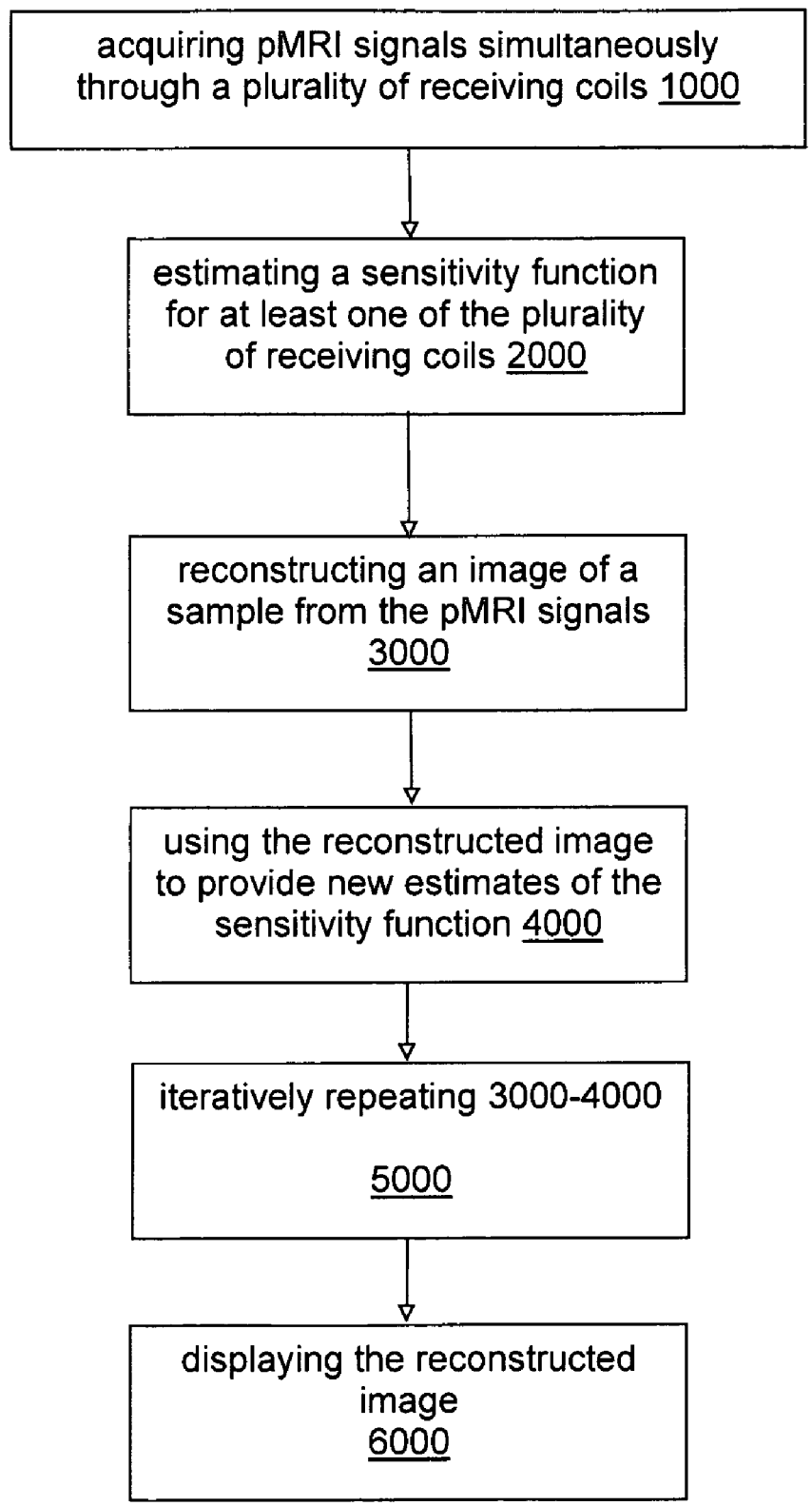
FIG. 1c shows a flow chart depicting the steps of one embodiment of the inventive method.

In another construction, the steps of the method are shown in FIG. 1c. Task 1000 acquires pMRI signals simultaneously through a plurality of receiving coils. Task 2000 estimates a sensitivity function for at least one of the plurality of receiving coils. Task 3000 reconstructs an image of a sample from the pMRI signals. Task 4000 uses the reconstructed image to provide new estimates of the sensitivity function. Task 5000 iteratively repeats tasks 3000-4000. Finally, task 6000 displays the reconstructed image.

Extending the linear formulation of generalized SENSE (GSENSE) with VD data, the image reconstruction problem is reformulated as a non-linear optimization problem, with the sensitivity functions represented by a parametric model with a set of unknown parameters. In solving the optimization problem, an iterative method is used. Specifically, starting with an initial estimation of coil sensitivities, the method alternately updates the reconstructed images and the coil sensitivity functions with each iteration and repeats until convergence. The results of reconstructing images of in vivo brain scans presented herein (FIGS. 3 and 4) demonstrate the superior quality of the inventive methods compared to self-calibrated GSENSE.

Figure 1D:
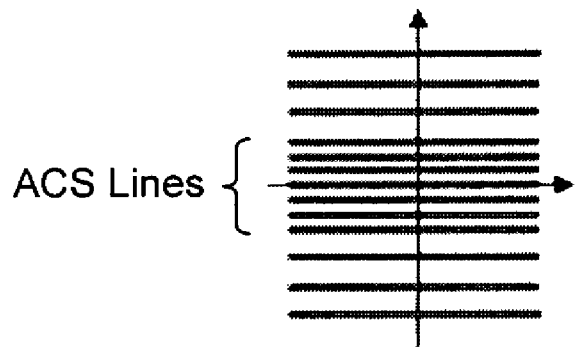
FIG. 1d shows a diagram of the Cartesian scanning trajectory in k-space.
Figure 1E:
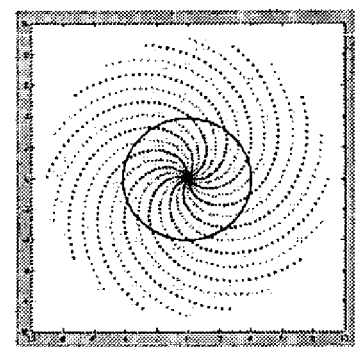
FIG. 1e shows a diagram of the spiral scanning trajectory in k-space.

The methods of the present invention are also applicable to MR data collected using a spiral trajectory (FIG. 1e). In many dynamic MRI applications, it is desirable to reduce imaging time to achieve high spatio-temporal resolution. A classical approach is to use fast-scan methods that traverse quickly through k-space. Among various dynamic MRI applications, data collection using a spiral trajectory is known to have several advantages over the Cartesian trajectory due to its reduced influence from $T_2$-decay and its robustness against bulk physiologic motion. When combined with pMRI techniques, the imaging speed can be further enhanced using a spiral trajectory. Parallel spiral imaging is especially useful in high-resolution functional MRI (fMRI), arterial spin labeling, diffusion imaging, and cardiac imaging.

There is a need for improved systems, apparatus, and methods of reconstructing MR data collected using spiral parallel imaging. Most existing techniques for spiral parallel imaging still require performing a separate calibration scan with full field of view before or after the accelerated scans are performed. In spiral SENSE, these scans are used to derive sensitivities, and in spiral GRAPPA, they are used for estimation of the fitting coefficients. As discussed above, the need to perform calibration scans prolongs the total imaging time, which reduces the benefits of reduced acquisition time that are achieved using parallel MRI. In addition, misregistrations or inconsistencies between the calibration scan and the accelerated scan may result in artifacts in the reconstructed images, which is a major concern in dynamic imaging applications.

In spiral and radial SENSE, even with a reduced number of interleaves, the central k-space is automatically sampled beyond the Nyquist rate, and thus can be used for estimation of sensitivities without the need for additional encodings to acquire the self-calibration data such as the ACS data that was collected with Cartesian trajectory as described above. This inherent self-calibration capability makes the self-calibrated technique especially of interest for spiral and radial trajectories. Nonetheless, the data that satisfy the Nyquist rate, being in the central k-space, only provide low spatial frequencies of coil sensitivity. Thus, using standard reconstruction techniques with spiral or radial pMRI data, the resulting truncation errors in sensitivity not only show up in the final reconstruction, but also deteriorate the conditioning of the inverse reconstruction problem.

First Embodiment: Use with Cartesian Trajectory Data

In one embodiment, the inventive methods are applied to MR data collected with a Cartesian trajectory. FIG. 1d shows a diagram of a variable density (VD) Cartesian scan in k-space, wherein the outermost regions of k-space are scanned at lower density than the central regions. The higher-density scans in the central region labeled "ACS Lines" correspond to the auto-calibration signal data that is used to produce the initial estimate of coil sensitivities in the inventive methods.

Development of one embodiment of the inventive image reconstruction methods begins with the GSENSE algorithm. In GSENSE with VD acquisition, the imaging equation can be formulated as a linear operation of the transverse magnetization image:

$$Ef=d, \quad [3]$$

where d is the vector formed from all k-space data acquired at all channels and f is the unknown vector formed from the desired full field of view (FOV) image to be solved for. The encoding matrix E consists of the product of Fourier encoding with subsampled k-space and coil-specific sensitivity modulation over the image, i.e.

$$E_{\{l,m\},n} = e^{-i2\pi \vec{k}_m \cdot \vec{r}_n} s_l(\vec{r}_n), \quad [4]$$

where m and n denote the indices for the k-space data and image pixels respectively. In image reconstruction, the image f is solved by the least-squares method either directly or iteratively given knowledge of acquired data d and sensitivities $s_l(\vec{r})$, where the sensitivities are usually estimated by Eq. [1] and directly plugged into the reconstruction algorithms. However, with this approach in GSENSE of sequential processing, any inaccuracy in sensitivity estimation can propagate to the reconstructed image.

Therefore, to improve the accuracy of sensitivity estimation using ACS data, the inventive methods (referred to as JSENSE) jointly estimate the sensitivities and SENSE reconstruction. The methods are based on VD acquisition, with both the ACS data as well as the reduced data being used for reconstruction. In JSENSE, instead of assuming that the sensitivity functions estimated from the ACS data are exactly accurate, some degree of uncertainty is introduced. Specifically, noting the encoding matrix E is a function of sensitivity, the imaging equation in Eq. [3] becomes $$E(a)f=d, \quad [5]$$

where a is the parameter representing the coil sensitivities and is also an unknown to be solved. Although there can be different ways to parameterize the sensitivities (e.g. wavelet or spline models), we use a simple polynomial function to model the coil sensitivities as $$s_l(\vec{r}) = \sum_{i=0}^{N} \sum_{j=0}^{N} a_{l,i,j}(x-\bar{x})^i(y-\bar{y})^j, \quad [6]$$

where $(x,y)=\vec{r}$ denotes the location of a pixel, $(\bar{x}, \bar{y})$ denotes the averaged location, and $a_{l,i,j}$ is the coefficient of a polynomial, forming the unknown vector a. We choose the highest power of x and y to be the same and define it as the order of the polynomial. The use of a high order polynomial improves the accuracy of the model, but also increases the number of unknowns to be solved for. Nonetheless, because of the smooth nature of coil sensitivity in general, a low order polynomial is usually sufficient. The polynomial can have any order, and in various embodiments the order ranges from 4 to 18. Under this model, the encoding matrix explicitly becomes:

$$E(a)_{\{l,m\},n} = \sum_{i,j} a_{l,i,j}(x_n-\bar{x})^i(y_n-\bar{y})^j e^{-i2\pi(k_{xm} \cdot x_n + k_{ym} \cdot y_n)}. \quad [7]$$

Although the discussion focuses on applying the inventive methods to two-dimensional data, the methods are also applicable to three-dimensional (3D) data as well. In 3D, the center k-space is sampled densely in all three directions and the outer k-space is under-sampled in two of the three directions. The center 3D k-space data are used to generate an initial estimate of the coil sensitivities in 3D. In this 3D case, d is the vector formed from all 3D k-space data acquired at all channels, f is the unknown vector formed from the desired full field of view (FOV) 3D image to be solved for, and $(x,y,z)=\vec{r}$, $(k_x,k_y,k_z)=\vec{k}$. Eq. [6] becomes a 3D polynomial:

$$s_l(\vec{r}) = \sum_{i=0}^{N} \sum_{j=0}^{N} \sum_{k=0}^{N} a_{l,i,j,k}(x-\bar{x})^i(y-\bar{y})^j(z-\bar{z})^k, \quad [6']$$

and as a result, Eq. [7] becomes:

$$E(a)_{\{l,m\},n} = \sum_{i,j,k} \frac{a_{l,i,j,k}(x_n - \bar{x})^i (y_n - \bar{y})^j}{(z_n - \bar{z})^k e^{-i2\pi(k_{xm} \cdot x_n + k_{ym} \cdot y_n + k_{zm} \cdot z_n)}}, \quad [7']$$

and Eq. [13] (below) will become:

$$F_{\{l,m\},\{l,i,j,m\}} = \sum_n \frac{\rho(x_n, y_n, z_n)}{x_n^i y_n^j z_n^k e^{-i2\pi(k_{xm} \cdot x_n + k_{ym} \cdot y_n + k_{zm} \cdot z_n)}}, \quad [13']$$

while the remaining calculations are largely unchanged.

Taking into account k-space data noise which is usually additive white Gaussian, we can jointly estimate the coefficients for coil sensitivities a and the desired image f by finding a penalized least-squares solution. Specifically, $$\{a, f\} = \underset{\{a,f\}}{\operatorname{argmin}} U(a, f), \quad [8]$$

where the cost function to be minimized is:

$$U(a, f) = \frac{1}{2}\|d - E(a)f\|^2. \quad [9]$$

Since the polynomial model already incorporates the smoothness constraint, no regularization is needed on sensitivity functions. Theoretically, as long as the dimension of data d exceeds the total dimension of the unknowns a and f, the above least-squares problem is overdetermined and thus has a unique solution. This unique nonlinear formulation of image reconstruction allows the sensitivity and the image to be estimated simultaneously, thereby preventing the errors of the independently-estimated sensitivities from propagating to the final reconstruction as in conventional SENSE.

In one embodiment, a greedy iterative algorithm is used to solve the joint optimization problem in Eq. [8]. So-called greedy iterative algorithms are used for solving complex problems by making locally optimal choices at each iteration and iteratively converging towards a globally optimal solution. Specifically, starting with an initial estimate of sensitivities by Eq. [1] using the ACS data, we alternate between updating the image and updating the polynomial coefficients of the coil sensitivities, both based on the optimization criterion in Eq. [8]. This updating procedure is repeated iteratively until the difference between the cost functions of two consecutive iterations is less than a threshold, which in one embodiment is 0.001% of the signal-to-noise-ratio; the corresponding image reconstructed at the final iteration gives the desired image. Any number of iterations may be required to reach the point where the cost function stops decreasing, although in some embodiments the cost function stops decreasing after 2-100 iterations, in other embodiments after 2-25 iterations, in still other embodiments after 2-10 iterations, and in yet other embodiments after 3-5 iterations.

To update the image, we fix the sensitivity functions to be the ones given by the previous iteration. Thus the image f can be reconstructed by minimizing Eq. [9]:

$$f = \min_f \frac{1}{2}\|d - Ef\|^2, \quad [10]$$

with E given by fixing a. Equation [10] becomes the same as the formulation of GSENSE with regularization. The solution is then found, for example, by the iterative conjugate gradient method whose details are described in Pruessmann et al. (Pruessmann K P, Weiger M, Böernert P. Advances in sensitivity encoding with arbitrary k-space trajectories. Magn Reson Med 2001; 46: 638-651). Other image reconstruction methods that are applicable to VD acquisition can also be used at this stage, such as SPACE RIP (Kyriakos W E, Panych L P, Kacher D F, Westin C-F, Bao S M, Mulkern R V, Jolesz F A. Sensitivity profiles from an array of coils for encoding and reconstruction in parallel (SPACE RIP). Magn Reson Med 2000; 44: 301-308); GEM (McKenzie C A, Yeh E N, Ohliger M A, Price M D, Sodickson D K. Self-calibrating parallel imaging with automatic coil sensitivity extraction. Magn Reson Med 2002; 47: 529-538; Sodickson D K, McKenzie C. A generalized approach to parallel magnetic resonance imaging. Med Phys 2001; 28:1629-1643); POCSENSE (Samsonov A A, Kholmovski E G, Parker D L, Johnson C R. POCSENSE: POCS-based reconstruction method for sensitivity encoded magnetic resonance imaging. Magn Reson Med 2004; 52: 1397-1406); and VD-SENSE (Madore B. UNFOLD-SENSE: A parallel MRI method with self-calibration and artifact suppression. Magn Reson Med 2004; 52: 310-320; King K F. Efficient variable density SENSE reconstruction. In: Proceedings of the 13th Annual Meeting of ISMRM, Miami, USA, 2005, p. 2418). Even the efficient Cartesian SENSE method (Pruessmann K P, Weiger M, Scheidegger M B, Boesiger P. SENSE: Sensitivity encoding for fast MRI. Magn Reson Med 1999; 42: 952-962) can be used for the reconstruction component, but may have degraded image quality because the ACS data are not used.

Similarly, to update the sensitivity functions, the image is fixed. Specifically, we minimize the cost in Eq. [9] with respect to the coefficients a given f:

$$a = \min_a \frac{1}{2}\|d - E(a)f\|^2. \quad [11]$$

With the polynomial model, the encoding equation E(a)f can be rewritten as a linear function of the polynomial coefficients, thereby Eq. [11] becomes $$a = \min_a \frac{1}{2}\|d - Fa\|^2, \quad [12]$$

which is a standard least-squares problem where $$F_{\{l,m\},\{l,i,j\}} = \sum_n \rho(x_n, y_n) x_n^i y_n^j e^{-i2\pi(k_{xm} \cdot x_n + k_{ym} \cdot y_n)} \quad [13]$$

is given. In general, the order of the polynomial used for representing the sensitivities is relatively low, so the least-squares solution can be directly obtained by $$a=(F^H F)^{-1} F^H d. \quad [14]$$

The obtained polynomial coefficients are then plugged back into Eq. [6] to refine the polynomial functions of sensitivities.

Second Embodiment: Use with Spiral Trajectory Data

In another embodiment, the inventive methods are applied to MR data collected with a spiral trajectory (FIG. 1e). In a spiral sampling trajectory, the center k-space is automatically sampled densely enough to satisfy the Nyquist sampling criterion, even in accelerated scans where some interleaves are skipped. FIG. 1e shows a diagram of spiral trajectory scan lines in k-space, with the circle in the central region indicating the area where scanning density is higher. Thus, it is not necessary to collect ACS data as in the Cartesian trajectory case discussed above. This so-called self-calibrating property is desirable in parallel imaging where the reduced data in the central k-space can be used for sensitivity estimation without the need for additional acquisition. To estimate the sensitivity functions, these truncated central k-space data are Fourier-transformed to generate several low-resolution reference images for all channels, and the sensitivity functions are obtained by normalizing these reference images by their sum-of-squares reconstruction.

The estimation can be mathematically expressed according to Eq. [1] above, where $\hat{s}_l(\vec{r})$ and $s_l(\vec{r})$ are the estimated and true sensitivities, respectively, $\rho(\vec{r})$ is the image, and $h(\vec{r})$ is the point spread function of the k-space sampling trajectory within a circle having a chosen radius. However, this estimation method implicitly assumes that sensitivity weighting and convolution with the point spread function are commutative, which is not satisfied in general. When the radius is less than:

$$k_0 = \frac{N_{leaf}}{2\pi FOV}, \quad [15]$$

where $N_{leaf}$ and FOV are the undersampled number of interleaves and the field of view, respectively, the corresponding point spread function has no aliasing artifacts, but is so wide that truncation effects are serious. As the radius of truncation circle increases, the point spread function becomes sharper, but aliasing artifacts start to appear. This tradeoff between reduced truncation effect and reduced aliasing artifacts leads to inaccurate sensitivity functions, which becomes serious especially at locations where the object transverse magnetization has high spatial frequency components. Consequently, the self-calibrated SENSE reconstruction suffers from residual aliasing artifacts.

Thus, the above-described JSENSE methods can be extended to improve the self-calibrated SENSE approach with spiral trajectory data. Specifically, we treat both the sensitivities $s_l(\vec{r}_n)$ and the desired image $\rho(\vec{r}_n)$ as unknowns in the imaging equation:

$$d_{l,m} = \sum_n s_l(\vec{r}_n)\rho(\vec{r}_n)e^{-i2\pi \vec{k}_m \cdot \vec{r}_n}, \quad [16]$$

where $d_{l,m}$ is the mth data point acquired on a spiral trajectory at the lth channel. To reduce the degree of freedom for the unknowns to be solved for, we use a polynomial parametric model instead of a pixel-based function for the coil sensitivities:

$$s_l(\vec{r}) = \sum_{i=0}^{N} \sum_{j=0}^{N} a_{l,i,j}(x-\bar{x})^i(y-\bar{y})^j, \quad [17]$$

where $(x, y) = \vec{r}$ denotes the location of a pixel, $(\bar{x}, \bar{y})$ denotes the image center location, and $a_{l,i,j}$ is the coefficient of a polynomial, forming an unknown vector a. Several other models, such as wavelet and spline, are also appropriate for the smooth sensitivity functions. With the unknown a written in the SENSE equation explicitly, the JSENSE method jointly solves Eq. [5] (see above) for a and the desired image vector f, where E(a) is the spiral SENSE encoding matrix shown in Eq. [7] above, and d is a vector for the acquired k-space data. The JSENSE method employs an iterative alternating optimization, where the self-calibrated SENSE reconstruction is used as the initial value for the first iteration, as described above.

The working examples presented below show that the JSENSE methods disclosed herein produce substantially improved reconstructions of pMRI data collected with either Cartesian or spiral trajectories.

The disclosed JSENSE methods are able to address two problems that are present in the existing image-domain self-calibrating technique when a large number of phase encodings are skipped for high acceleration. First, when a small number of ACS data are used for sensitivity estimation, these data are truncated from the original full data with a small truncation window, which causes the estimated sensitivities to have serious ringing at object boundaries. The erroneous sensitivities, when directly applied to a reconstruction algorithm, lead to aliasing artifacts in the final reconstruction. In JSENSE, the iterative update of the coil sensitivities implicitly takes advantage of the sub-sampled data from outer k-space in addition to the ACS data so that the truncation error in sensitivity is reduced. Second, when a large reduction factor is used, the g-factor is deteriorated by the inaccurate sensitivities, which leads to a poor signal-to-noise ratio (SNR) in the reconstruction. The problem is alleviated by JSENSE because the iterative cross-validation regularizes the sensitivity functions such that the g-factor is improved.

The disclosed JSENSE methods have a large computational complexity. Each iteration of JSENSE requires a complete GSENSE reconstruction and sensitivity estimation. The GSENSE reconstruction can be replaced by any other method applicable to VD acquisition, and due to the separability of VD data, it can be decomposed to several one-dimensional reconstructions. In contrast, sensitivity estimation has to be carried out in two dimensions because of the two-dimensional parametric model, and thus dominates the computational complexity of the disclosed JSENSE methods.

The computations of the inventive methods increase with the order of the polynomial model. For an order-N polynomial, the number of unknown coefficients to be solved is $L(N+1)^2$ with L being the number of coils, and therefore $O(L^3 N^6)$ computations are needed to solve the linear equation for the coefficients. As an example of the computational requirements of JSENSE, for the brain data shown in Example 1 below, the running time of JSENSE is 510 seconds per iteration, in contrast to 36 seconds for GSENSE, on an Intel Pentium IV 1.3 GHz desktop. However, the computational needs may be reduced by optimizing the code implementation of JSENSE. In addition, as computers become faster, the computational complexity may be of less concern than the data acquisition speed.

In addition, models other than polynomial (e.g. wavelet or spline models) may be investigated to accurately represent the spatial variation of coil sensitivities with fewer model coefficients to be solved. Other optimization algorithms such as variable projection may be applied to improve computational efficiency.

The inventive JSENSE method improves image reconstruction quality in dynamic parallel imaging applications, due to its ability to accurately update the continuously-changing sensitivities and its superior reconstruction quality when a large net acceleration factor is used to reduce motion artifacts that would otherwise arise with long acquisition times.

Similar to the self-calibrated spiral SENSE method, the JSENSE methods disclosed herein reconstruct the desired image using only the reduced spiral data without the need for additional full scans, thus shortening imaging time and avoiding motion-induced misregistration problems. On the other hand, the JSENSE methods use the self-calibration results as the initial value to further improve both the sensitivities and reconstruction using cross validation, thus producing results superior to those obtained with other techniques such as self-calibrated spiral SENSE.

The sensitivity maps from the full (SoS) data only provide a reference but may not provide a complete picture. FIGS. 6a-6c show estimated sensitivity maps of the first channel of a watermelon phantom. The sensitivity map in FIG. 6c has a similar shape to that in FIG. 6a, but lacks the object-dependent features in FIG. 6a. These features may be artifacts caused by the pixel-wise division in the estimation procedure, which may amplify error and noise at locations where the image has low intensity (e.g. the peel and seeds of the watermelon). JSENSE does not rely on pixel-wise division and thus avoids such object-dependent artifacts.

The disclosed JSENSE reconstruction methods depend on the initial value, which is set to be the self-calibrated spiral SENSE in the disclosed spiral trajectory embodiments. This dependence can be seen by the error curve comparison in FIG. 8. The trend of the JSENSE errors exactly matches that of the self calibrated SENSE errors. It suggests that the JSENSE result did not reach a global optimum because otherwise its errors should be independent of the radius, which affects the initial value only. The results show that the optimal k-space radius (4/FOV) for estimating coil sensitivity is almost the same as the Nyquist radius $k_0=3.82$/FOV in Eq. [15].

JSENSE can improve the image signal-to-noise ratio (SNR). The SENSE matrix is usually ill-conditioned, which is deteriorated by inaccurate sensitivities. The accurate sensitivities by JSENSE can improve the condition and thus SNR of the reconstruction. This is demonstrated in the cardiac imaging results in FIGS. 9 and 10, where JSENSE looks much less noisy than the self-calibrated SENSE. Although the SNR improvement can be calculated rigidly as done in Example 1 below for the Cartesian trajectory data, computation of g-factor maps is challenging for spiral trajectory data. The NMSE serves as an alternative for both artifacts and noise measurements.

As discussed above, the disclosed JSENSE methods are computationally intensive due to the iterative cross validation on top of the conventional SENSE. In the present implementation, NUFFT was used to speed up the conjugate gradient spiral SENSE reconstruction. In the spiral watermelon experiment, the running time for JSENSE is 110 seconds on an Intel Xeon-2.33 GHz workstation, which is much longer than the 3.4 seconds for the conjugate gradient SENSE. The computational complexity of JSENSE will be reduced significantly when combined with faster algorithms for non-Cartesian SENSE.

The methods of the present invention, which are exemplified in the following Examples, can be implemented on a computer system 12 connected to a pMRI system (FIG. 1a). In FIG. 1a, the photo in the inset shows a set of receiver coils similar to those shown diagrammatically in the line drawing. The computer system 12 has an input device 14, an output device 16, a storage medium 18, and a processor 20 (FIG. 1a). Possible input devices 14 include a keyboard, a computer mouse, a touch screen, and the like. Output devices 16 include various display devices including a cathode-ray tube (CRT) computer monitor, a liquid-crystal display (LCD) computer monitor, and the like, as well as printing devices such as an ink jet printer, a laser printers, and the like. Storage media 18 include various types of memory such as a hard disk, RAM, flash memory, and other magnetic, optical, physical, or electronic memory devices. The processor 20 is any typical computer processor for performing calculations and directing other functions for performing input, output, calculation, and display of data related to the inventive methods. The inventive methods comprise instructions and data that are stored on the storage medium 18. In addition, the inventive methods operate on data collected from the attached pMRI system 30.

In use, the pMRI data are collected from a sample, including for example a human patient. In one embodiment, the pMRI data are reconstructed using the methods described herein in near real time and displayed on the output device 16, e.g. a computer monitor. In another embodiment, the data are reconstructed at a later time, i.e. off-line.

Figure 1F:
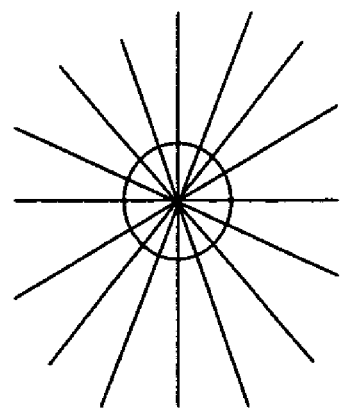
FIG. 1f shows a diagram of the radial scanning trajectory in k-space.

The disclosed methods are also applicable to data collected with a radial scanning trajectory (FIG. 1f). As with the spiral scanning trajectory, even with a reduced number of interleaves the central k-space is automatically sampled beyond the Nyquist rate in radial scanning (see circle in FIG. 1f). Thus, the data in this central k-space region can be used for estimation of sensitivities without the need for additional encodings to acquire the self-calibration data, such as the ACS data that was collected with Cartesian trajectory as described above. The inventive methods can be performed on radial trajectory data using the procedures described above.

Furthermore, as discussed above the inventive methods are also applicable to data collected in two-dimensional as well as three-dimensional k-space. Where appropriate, the explanations herein show where the algorithms are adapted to operate on two-dimensional or three-dimensional data. In some embodiments, three-dimensional image reconstructions can be attained by collecting and processing a series of two-dimensional samples and subsequently combining the resulting two-dimensional images to produce a three-dimensional image.

EXAMPLE 1

In one example, the inventive JSENSE methods were applied to data collected using a Cartesian trajectory. JSENSE methods were implemented using Matlab (MathWorks, Natick, Mass.). To test performance of the methods, in Vivo MR data from a healthy volunteer was acquired on a 3-T Excite MR system (GE Healthcare Technologies, Waukesha, Wis., USA) using an eight-channel head coil (MRI Devices, Waukesha, Wis., USA) and a 3-D SPGR pulse sequence (TE=2.38 ms, TR=7.32 ms, flip angle=12°, FOV=18.7 cm×18.7 cm, matrix=200×200, slice thickness=1.2 mm).

A data set using a Cartesian scanning trajectory was acquired in full, and some phase encodings were then manually removed to simulate VD acquisition in pMRI. The full data were combined to obtain the sum-of-squares (SoS) reconstruction, which serves as a gold standard (reference standard) for comparison. Reduced VD data with different nominal reduction factors excluding the ACS data ($R_{nom}$) and different numbers of ACS lines were used to reconstruct the desired image using JSENSE methods, as well as self-calibrated GSENSE. For different nominal reduction factors and numbers of ACS lines, the net reduction factors ($R_{net}$) were calculated. In JSENSE, the order of the polynomial for coil sensitivities was chosen to be in the range of 1<N<18, although other ranges are possible. In self-calibrated GSENSE, the coil sensitivities were carefully estimated from the central ACS lines using the methods described above. Briefly, the ACS data were apodized using a Kaiser window with a window shape parameter of 4, followed by the sensitivity estimation formulated in Eq. [1]. The obtained sensitivity map was then smoothed by polynomial fitting as described in Pruessmann et al. (Pruessmann K P, Weiger M, Scheidegger M B, Boesiger P. SENSE: Sensitivity encoding for fast MRI. Magn Reson Med 1999; 42: 952-962) before being used for GSENSE reconstruction. For comparison purposes, the standard sensitivity map from the full-scan data was also generated using Eq. [1] followed by the same polynomial fitting procedure.

The g-map given by $g_\rho = \sqrt{[(E^H \Psi^{-1} E)^{-1}]_{\rho,\rho} (E^H \Psi^{-1} E)_{\rho,\rho}}$, at pixel $\rho$, where $\Psi$ is receiver noise matrix, characterizes the SNR degradation $SNR_{full}/(\sqrt{R} SNR_{red})$, where R is the acceleration factor. The estimated sensitivity maps, the corresponding g-maps, and the final reconstructions obtained by SoS, JSENSE, and GSENSE were evaluated visually in terms of image quality (e.g. noise and artifacts). With SoS as the gold standard, reconstructions were also compared quantitatively in terms of normalized mean-squared-error (NMSE). The NMSE is defined as the normalized difference square between the reconstructed image ($I_{estimated}$) and the SoS as the gold standard ($I_{standard}$):

$$NMSE = \frac{\sum_{\vec{r}} ||I_{estimated}(\vec{r})| - |I_{standard}(\vec{r})||^2}{\sum_{\vec{r}} |I_{standard}(\vec{r})|^2}. \quad [18]$$

This definition is equivalent to the artifact power (AP) defined by McKenzie et al. (McKenzie C A, Yeh E N, Ohliger M A, Price M D, Sodickson D K. Self-calibrating parallel imaging with automatic coil sensitivity extraction. Magn Reson Med 2002; 47: 529-538). As noted by McKenzie et al., a higher value of NMSE (or AP) represents reduced image quality, which suggests both increased image artifacts and noise. In addition, the sensitivity estimation errors were also calculated using Eq. [18], where we used the SoS weighted by the estimated sensitivity map for $I_{estimated}$ and the SoS weighted by the standard sensitivity map calculated from the full scan for $I_{standard}$. The reason that we did not subtract the estimated and standard sensitivity maps directly is that the standard map is not exactly accurate due to noise amplification due to division in Eq. [1], which is especially serious at the regions where the full-scan image has low intensity. Subtracting the sensitivity-weighted SoS gives more insight because the subtraction gives zero if the estimated sensitivity is accurate.

Figure 2:
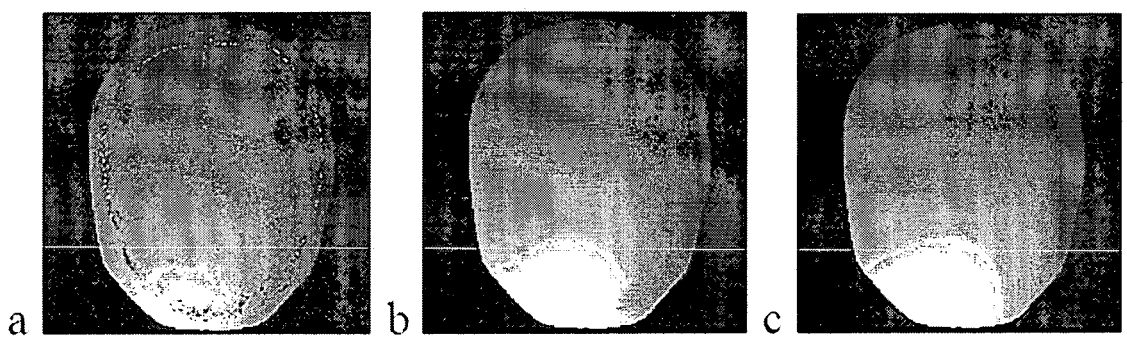
FIGS. 2a-2c show estimated sensitivity maps of the first channel based on full-scan data (FIG. 2a), self-calibration with 32 auto-calibration signal (ACS) lines (FIG. 2b), and JSENSE with 32 ACS lines and $R_{nom}$=4 (FIG. 2c)
Figure 3:
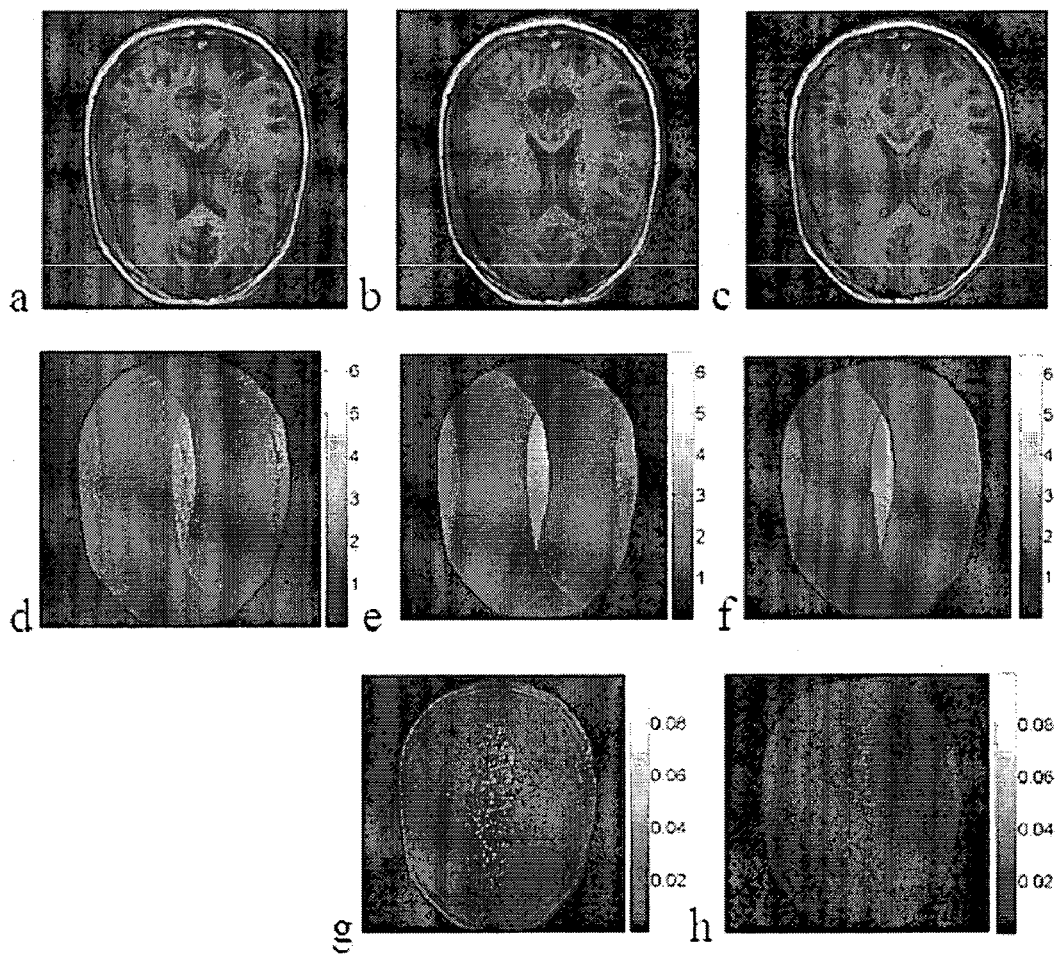

FIGS. 2a, 2b, and 2c show the estimated sensitivity maps of the first channel based on the full scan data, the ACS data using the self-calibration method (SC), and the inventive JSENSE method (JS) with $R_{nom}=4$, respectively. The sensitivity map estimated from the full scan has spatially-dependent noise that is large at the skull area where the image intensity is low. The self-calibration method generates a map that is less noisy but has truncation effects. The map estimated by JSENSE, on the other hand, visually agrees with the smooth variation of electromagnetic fields without noise or truncation effects. The qualitative evaluation of these sensitivity errors for all 8 channels is given in Table 1. The error for the sensitivity map from the full scan is zero as expected, and thus is not shown. The comparison suggests that the JSENSE method improves the accuracy of the sensitivities with each iteration.

TABLE 1

| | NMSEs of sensitivity-weighted images from 8 channels | | | | | | | |
| --- | --- | --- | --- | --- | --- | --- | --- | --- |
| | Ch 1 | Ch 2 | Ch 3 | Ch 4 | Ch 5 | Ch 6 | Ch 7 | Ch 8 |
| JS | 5.37% | 5.46% | 4.96% | 4.45% | 4.67% | 4.72% | 4.53% | 4.59% |
| SC | 5.99% | 6.01% | 5.48% | 5.02% | 5.05% | 5.17% | 5.06% | 5.11% |

Figure 4:
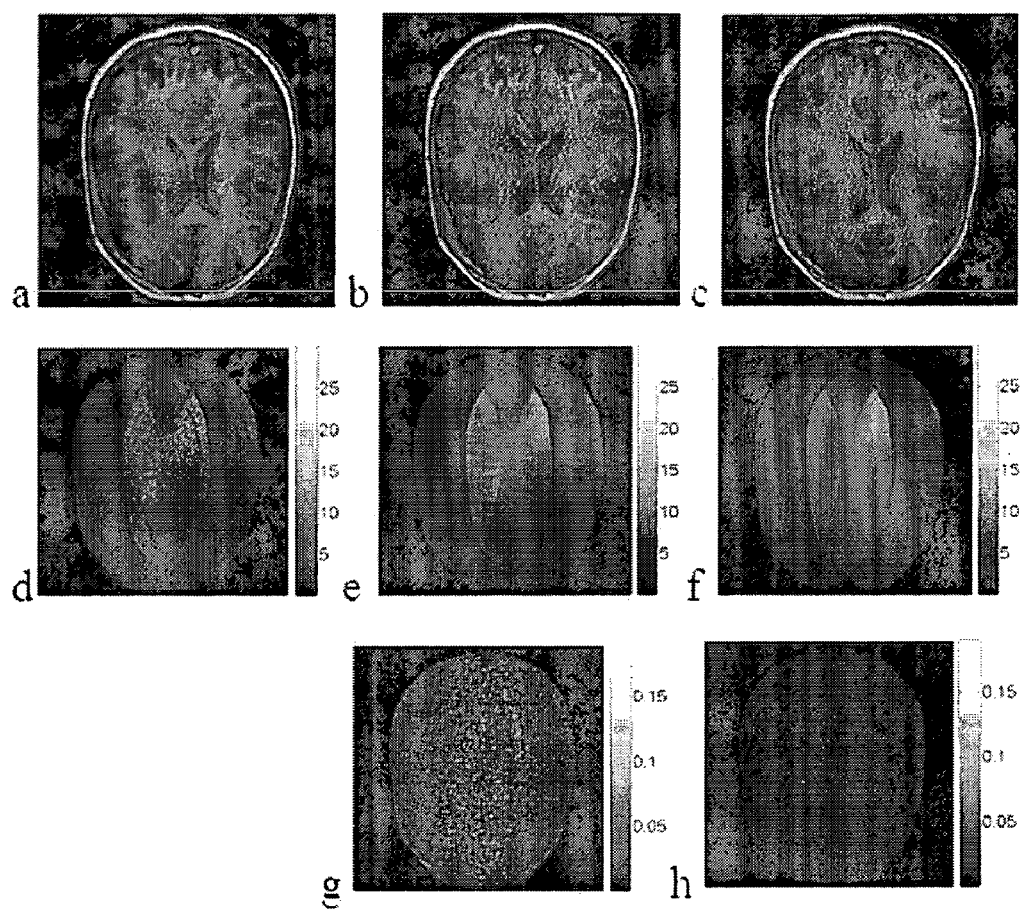

FIGS. 3a, 3b, and 3c show reconstructed brain images from a set of 8-channel variable density (VD) data using the SoS, GSENSE, and the inventive JSENSE methods, respectively, also with 32 ACS lines and $R_{nom}=3$ ($R_{net}=2.27$). FIGS. 3d, 3e, and 3f show the corresponding g-maps. Note that the g-maps are shown for comparison only, and they do not reflect the actual noise enhancement in the GSENSE and JSENSE reconstructed images because the ACS data is used in both cases and the conjugate gradient method has an inherent regularization effect. All images are normalized and shown on the same scale. It is seen that JSENSE is superior to self-calibrated GSENSE due to more accurate sensitivities. This can be seen more clearly in the difference image with SoS in FIGS. 3g and 3h. The same set of comparisons for a set of 8-channel variable density (VD) data having 32 ACS lines and $R_{nom}=5$ ($R_{net}=3.05$) is given in FIG. 4, which further demonstrates the superior image quality of JSENSE. Thus, brain images reconstructed using SoS (FIG. 4a), GSENSE (FIG. 4b), and the methods of the present invention (JSENSE) (FIG. 4c) are shown. The second row of FIG. 4 shows the g-maps corresponding to the sensitivities from full-scan data (FIG. 4d), self-calibration (FIG. 4e), and JSENSE (FIG. 4f). The difference maps between GSENSE and SoS reconstructions (FIG. 4g) and JSENSE and SoS reconstructions (FIG. 4h) are shown on the third row.

The NMSEs (with the SoS reconstruction as the gold standard) of the GSENSE and JSENSE reconstructions are compared in Table 2 with columns representing the numbers of ACS lines and rows representing the nominal reduction factors. The net reduction factors are also shown in the table. For small ($R_{net}$<2.03) or large ($R_{net}$>3.75) net reduction factors, all methods achieve similar good or poor visual quality; thus, the NMSEs in these cases may provide little insight and are not included here. The results suggest that the inventive method is superior when rather large data reduction is desired.

tion. With SoS as the gold (reference) standard, reconstructions were also compared quantitatively in terms of normalized mean-squared-error (NMSE) for various radii of truncation circles. The error curves plotted in FIG. 8 demonstrate that JSENSE is superior to the conventional self-calibrated SENSE for any given radius, and the optimal radius is the same for both methods, being 4/FOV.

TABLE 2

NMSEs of reconstructions from brain data

| | $R_{nom}$ = 3 | | | $R_{nom}$ = 4 | | | $R_{nom}$ = 5 | | | $R_{nom}$ = 6 | | |
|---|---|---|---|---|---|---|---|---|---|---|---|---|
| ACS | $R_{net}$ | JS | GS | $R_{net}$ | JS | GS | $R_{net}$ | JS | GS | $R_{net}$ | JS | GS |
| 24 | 2.4 | 0.41% | 0.67% | 2.9 | 0.91% | 1.40% | 3.4 | 1.29% | 2.29% | 3.8 | 1.73% | 3.31% |
| 32 | 2.3 | 0.36% | 0.56% | 2.7 | 0.69% | 1.13% | 3.1 | 1.08% | 2.06% | 3.3 | 1.54% | 2.73% |
| 40 | 2.1 | 0.32% | 0.49% | 2.5 | 0.60% | 0.99% | 2.8 | 0.97% | 1.71% | 3.0 | 1.39% | 2.68% |
| 48 | 2.0 | 0.29% | 0.41% | 2.3 | 0.52% | 0.86% | 2.6 | 0.87% | 1.49% | 2.7 | 1.25% | 2.46% |

As an iterative technique, the convergence behavior of JSENSE is also studied. In FIGS. 5a and 5b, the NMSE is plotted as a function of the number of iterations for different number of ACS lines and different nominal reduction factors. It shows that JSENSE converges rather fast for all cases.

EXAMPLE 2

In another example, data were collected using a spiral trajectory and reconstructed using the methods of the present invention. Both phantom and human experiments were performed on a GE 3T Excite whole-body scanner (Waukesha, Wis.). In the phantom experiment, a set of watermelon phantom data was acquired with an eight channel head coil and gradient echo sequence (TE=3.2 ms, TR=2 sec, FOV=24 cm, matrix=256×256, slice thickness=5 mm). The fully-sampled data were acquired with 24 interleaves, and 2332 points in each interleaf. We simulate the downsampled data with a reduction factor of 2 by retaining every other interleaf. In the cardiac imaging experiment, 27 cardiac phases were acquired on a 3-T Excite MR system (GE Healthcare Technologies, Waukesha, Wis., USA) using a four-channel cardiac coil and the cardiac gated spiral SPGR (125 kHz, 30-degree flip angle, 36 cm FOV, 8 mm slice thickness, min TE) with breath-holding. The full acquisition includes 20 interleaves per 256×256 image with 1024 points in each interleaf. Spectral-spatial selective excitation was employed to suppress fat signals. Similar to the phantom experiment, 10 out of 20 interleaves were manually selected to simulate the reduced acquisition with R=2. The inventive methods are implemented in Matlab (MathWorks, Natick, Mass.).

FIGS. 6a-6c show a comparison of the sensitivity maps estimated from the 2× undersampled data within a circle of optimal radius 4/FOV (field of view) using the conventional self-calibration method ("SC," FIG. 6b) and the JSENSE method ("JS," FIG. 6c), with the map estimated from the full data ("SoS," FIG. 6a) as the reference for comparison. The order of the polynomial for coil sensitivities was chosen to be 12. It can be seen that the JSENSE methods improve the estimation over the conventional self-calibration method.

FIGS. 7a-7c show the corresponding final reconstructions obtained by the sum-of-squares ("SoS," FIG. 7a) from full scan, self-calibrated SENSE using conjugate gradient ("SC," FIG. 7b), and JSENSE ("JS," FIG. 7c). In comparison, JSENSE methods significantly suppress the artifacts associated with the conventional self-calibrated SENSE reconstruc- FIG. 9 shows the cardiac reconstructions using SoS, self-calibrated SENSE, and JSENSE at one cardiac phase. The cardiac region is zoomed and a set of results are compared at several different cardiac phases in FIG. 10. It is seen that the inaccurate sensitivities cause severe artifacts and noise enhancement in self-calibrated spiral SENSE, which are greatly reduced in JSENSE reconstruction.

What is claimed is:

1. A method of parallel magnetic resonance imaging (pMRI) comprising:
   applying one or more RF pulses in combination with one or more gradient encoding processes;
   acquiring resultant pMRI signals simultaneously through a plurality of receiving coils, wherein each coil has a localized sensitivity with respect to an imaged volume;
   simultaneously estimating a first set of values for a function which represents the imaged volume and a second set of values for a sensitivity function for at least one of the plurality of receiving coils, wherein the first and second sets of values are simultaneously estimated based at least in part on gradient encoding functions associated with the gradient encoding processes; and
   transmitting the first set of values to a device.

2. The method of claim 1, wherein simultaneously estimating comprises minimizing a cost function.

3. The method of claim 1, wherein simultaneously estimating comprises finding a penalized least-squares solution and minimizing a cost function.

4. The method of claim 1, wherein the device comprises at least one of a storage device, a printing device, and a display device.

5. The method of claim 1, wherein acquiring resultant pMRI signals comprises acquiring pMRI signals using at least one of a Cartesian trajectory, a spiral trajectory, and a radial trajectory.

6. The method of claim 1, wherein acquiring resultant pMRI signals comprises acquiring resultant pMRI signals in two dimensional k-space or three dimensional k-space.

7. A method of parallel magnetic resonance imaging (pMRI) comprising:
   (a) acquiring pMRI signals simultaneously through a plurality of receiving coils, wherein each coil has a localized sensitivity with respect to an imaged volume;
   (b) using at least some of the acquired pMRI signals to estimate a sensitivity function for at least one of the plurality of receiving coils;

(c) reconstructing an image of a sample from the pMRI signals from the plurality of receiving coils using the estimated sensitivity function;

(d) using the reconstructed image to provide new estimates of the sensitivity function for at least one of the plurality of receiving coils;

(e) iteratively repeating steps (c)-(d) at least once; and (f) transmitting the reconstructed image to a device, wherein the acquired pMRI signals comprise variable density data including auto-calibration signal (ACS) lines, wherein the ACS lines are used in step (b) to estimate a sensitivity function for at least one of the plurality of receiving coils.

8. The method of claim 7, wherein transmitting the reconstructed image to a device comprises at least one of: saving the reconstructed image to storage media, printing the reconstructed image on a printing device, and displaying the reconstructed image on a display device.

9. The method of claim 7, wherein acquiring pMRI signals comprises acquiring pMRI signals using at least one of a Cartesian trajectory, a spiral trajectory, and a radial trajectory.

10. The method of claim 7, wherein acquiring pMRI signals comprises acquiring pMRI signals in two dimensional k-space or three dimensional k-space.

11. The method of claim 7, wherein the acquired pMRI signals comprise variable density data.

12. The method of claim 7, wherein substantially all of the acquired pMRI signals are used to estimate a sensitivity function for at least one of the plurality of receiving coils.

13. The method of claim 7, wherein the pMRI signals are acquired using a Cartesian trajectory.

14. The method of claim 7, wherein the pMRI signals are acquired using a spiral trajectory.

15. The method of claim 7, wherein the sensitivity function for at least one of the plurality of receiving coils is a polynomial function.

16. The method of claim 7, further comprising jointly estimating the image of the sample and the sensitivity functions for at least one of the plurality of receiving coils using a penalized least-squares solution.

17. The method of claim 16, wherein a greedy iterative algorithm is used to jointly estimate the image of the sample and the sensitivity functions for at least one of the plurality of receiving coils.

18. The method of claim 16, wherein jointly estimating using the penalized least-squares solution comprises minimizing a cost function.

19. The method of claim 16, wherein jointly estimating further comprises uses a penalized least-squares solution given by $$\{a, f\} = \operatorname*{argmin}_{\{a,f\}} U(a, f)$$

and minimizing the cost function U given by $$U(a, f) = \frac{1}{2} \|d - E(a)f\|^2,$$

where a designates the sensitivity functions for at least one of the plurality of receiving coils, f designates the image of the sample, and d is a vector comprising the acquired pMRI signals.

* * * * *